(12) United States Patent
Nagano

(10) Patent No.: US 8,623,701 B2
(45) Date of Patent: Jan. 7, 2014

(54) SEMICONDUCTOR DEVICE, SEMICONDUCTOR DEVICE STORAGE METHOD, SEMICONDUCTOR DEVICE MANUFACTURING METHOD, AND SEMICONDUCTOR MANUFACTURING APPARATUS

(75) Inventor: Hisanori Nagano, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 223 days.

(21) Appl. No.: 13/110,409

(22) Filed: May 18, 2011

(65) Prior Publication Data
US 2011/0304033 A1    Dec. 15, 2011

(30) Foreign Application Priority Data
Jun. 15, 2010    (JP) .................................. 2010-136045

(51) Int. Cl.
*H01L 21/00*    (2006.01)

(52) U.S. Cl.
USPC ........... 438/107; 438/127; 438/123; 257/676; 257/E21.499; 257/E21.502

(58) Field of Classification Search
USPC .......... 438/107, 127, 123; 257/676, E23.031, 257/E21.499, E21.502
See application file for complete search history.

(56) References Cited

U.S. PATENT DOCUMENTS

2006/0043641 A1 * 3/2006 Kuratomi et al. ........ 264/272.17

FOREIGN PATENT DOCUMENTS

| JP | 6-061284 | 3/1994 |
| JP | 2006-073600 | 3/2006 |

* cited by examiner

*Primary Examiner* — Thinh T Nguyen
(74) *Attorney, Agent, or Firm* — Young & Thompson

(57) ABSTRACT

A semiconductor package has a semiconductor chip, a lead frame in which a semiconductor chip is mounted on a die pad, and a resin sealing the semiconductor chip and the die pad from an upper surface and a lower surface, the resin has a concave portion disposed at the surface and a concave portion situated inside the concave portion in a plan view.

10 Claims, 4 Drawing Sheets

SEMICONDUCTOR DEVICE, SEMICONDUCTOR DEVICE STORAGE METHOD, SEMICONDUCTOR DEVICE MANUFACTURING METHOD, AND SEMICONDUCTOR MANUFACTURING APPARATUS

CROSS-REFERENCE TO RELATED APPLICATION

The disclosure of Japanese Patent Application No. 2010-136045 filed on Jun. 15, 2010 including the specification, drawings and abstract is incorporated herein by reference in its entirety.

BACKGROUND

The present invention relates to a semiconductor device having a concave portion, a method for storing semiconductor device, a method of manufacturing a semiconductor device and an apparatus manufacturing a semiconductor.

Since a semiconductor chip tends to change the properties thereof under the effect of temperature change or dusts, the chip is resin-shield and served for use. A step of resin sealing a semiconductor chip is performed by forming a semiconductor package by filling a resin in a die where a semiconductor chip is disposed and then pushing out the semiconductor package from the die by an ejector pin.

However, in the step of sealing the semiconductor chip with the resin, resin burrs are sometimes formed to the periphery of an ejector pin trace formed in a semiconductor package. According to Japanese Unexamined Patent Publication No. Hei06(1994)-61284, it is described that an error is caused to an outer profile size of a semiconductor package. Further, Japanese Unexamined Patent Publication No. 2006-073600 describes that the planarity of a semiconductor package becomes uneven in a baking step after resin sealing. They lead to failure of the quality of the semiconductor package. Then, it is extremely disadvantageous to perform operation of removing resin burrs after forming the semiconductor package in view of the operation steps. For solving the problems described above, there are techniques described in Japanese Unexamined Patent Publication No. Hei06(1994)-61284 and Japanese Unexamined Patent Publication No. 2006-073600.

According to the techniques described in Japanese Unexamined Patent Publication No. Hei06(1994)-61284 and Japanese Unexamined Patent Publication No. 2006-073600, a depression is formed at the periphery of a portion where an ejector pin presses the resin. It is described that the failure of the quality of the semiconductor package can be suppressed by forming resin burrs in the depression formed in the semiconductor package even without operation for removing the resin burrs.

SUMMARY

In a case of storing semiconductor packages in stack, when resin burrs are present in the semiconductor package, flaws are formed to the surface of the semiconductor package to sometimes deteriorate the appearance on the surface of the semiconductor package. It may be considered to solve the problem by the techniques described in Japanese Unexamined Patent Publication No. Hei06-61284 and Japanese Unexamined Patent Publication No. 2006-073600. On the other hand, decrease in the thickness is desired for the semiconductor package. The techniques described in Japanese Unexamined Patent Publication No. Hei06-61284 and Japanese Unexamined Patent Publication No. 2006-073600 can be applied only to semiconductor packages having a thickness capable of ensuring the depth of the concave portion due to the trace of the ejector pin and the depth of the depression formed at the periphery of the trace of the ejector pin. Accordingly, this cannot be applied to a semiconductor package in which the thickness is decreased.

According to an aspect of the present invention, there is provided a semiconductor device which includes:
a semiconductor chip, and
a lead frame where the semiconductor chip is mounted on a die pad, and
a resin sealing the semiconductor chip and the die pad from an upper surface and a lower surface, and
the resin has a first concave portion disposed at the surface, and a second concave portion situated inside the first concave portion in a plan view.

According to another aspect of the invention, the second concave portion disposed at the rearface of the semiconductor package is situated inside the first concave portion disposed at the surface of the semiconductor package in a plan view. Then, in a case of storing semiconductor packages in stack, resin burrs formed at the peripheral edge of the second concave portion disposed at the rearface of the semiconductor package situated on the upper side is situated inside the first concave portion of the semiconductor package on the lower side, the resin burrs are not in contact with the surface of the semiconductor package situated on the lower side. Accordingly, this can prevent flaws formed in the surface of the semiconductor package. Then, it may suffice that the semiconductor package has a thickness capable of ensuring the depth of the concave portion due to the trace of the ejector pin. Accordingly, it is possible to suppress deterioration of the appearance of the semiconductor package and decrease the thickness of the semiconductor package without performing an operation of removing the resin burrs after forming the semiconductor package.

According to another aspect of the present invention, there is provided a method of storing a semiconductor device in which the semiconductor device has a semiconductor chip, a lead frame where the semiconductor chip is mounted on a die pad, and a resin sealing the semiconductor chip and the die pad from an upper surface and a lower surface in which the resin has a first concave portion disposed at the surface and a second concave portion disposed at the rearface and situated inside the first concave portion in a plan view in which semiconductor devices are stacked to each other such that the second concave portion in the semiconductor device on the upper side is situated inside the first concave portion in the semiconductor device on the lower side in a plan view.

According to still another aspect of the present invention, there is provided a method of manufacturing semiconductor device including the steps of arranging a lead frame where the semiconductor chip is mounted on a die pad in the cavity of a mold, filling a resin in the cavity and sealing the semiconductor chip and the die pad with the resin from an upper surface and a lower surface, and pushing out the lead frame from the die by a first ejector pin protruding from the upper surface of the cavity and a second ejector pin protruding from the bottom of the cavity, in which a portion of the second ejector pin pressing the resin is situated inside the portion of the first ejector pin pressing the resin in a plan view.

According to yet another aspect of the present invention, there is provided an apparatus for manufacturing a semiconductor including a die for holding a lead frame where a semiconductor chip is mounted on a die pad in a cavity and sealing the semiconductor chip and the die pad with a resin from an upper surface and a lower surface, a first ejector pin protruding from the upper surface of the cavity, a second ejector pin protruding from the bottom of the cavity, in which a portion of the second ejector pin pressing the resin is situated inside a portion of the first ejector pin pressing the resin in a plan view.

According to the invention, the appearance of the semiconductor package can be suppressed from being impaired and the semiconductor package can be decreased in the size even without performing an operation of removing the resin burrs.

BRIEF DESCRIPTION OF THE DRAWINGS

FIG. 5 is a cross sectional view showing a method of manufacturing the semiconductor package shown in FIG. 1; in which FIG. 5A is a cross sectional view showing a step of arranging a lead frame to a cavity, FIG. 5B is a cross sectional view showing a step succeeding the step in FIG. 5A, FIG. 5C is a cross sectional view showing a step succeeding the step in FIG. 5B, FIG. 5D is a cross sectional view showing a step succeeding the step in FIG. 5C.

DETAILED DESCRIPTION

Figure 1:
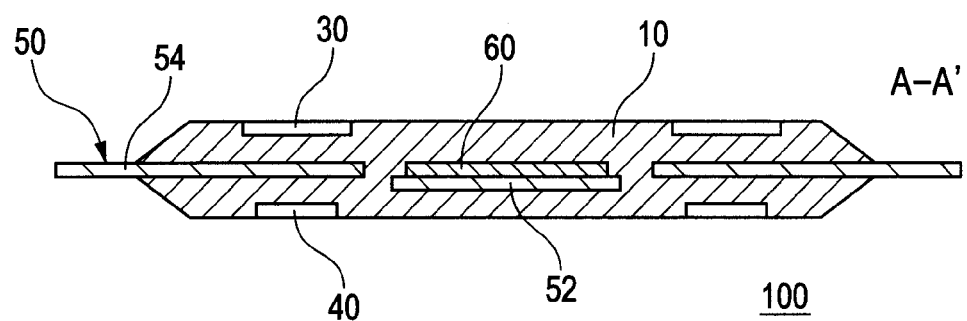
FIG. 1 is a cross sectional view showing a semiconductor package according to an embodiment of the invention.

The present invention is to be described by way of a preferred embodiment with reference to the drawings. Throughout the drawings, identical constituent elements carry the same reference numerals for which explanations are to be omitted optionally.

FIG. 1 is a cross sectional view showing a semiconductor package 100 according to a preferred embodiment of the invention. FIG. 1 shows a cross section A-A' in FIG. 2 to be described later. The semiconductor package 100 has a semiconductor chip 60, a lead frame 50, and a resin 10.

The semiconductor chip 60 is mounted on a die pad 52 of the lead frame 50. The semiconductor chip 60 and the die pad 52 are sealed from an upper surface and a lower surface with the resin 10. Lead terminals 54 extend to the outside of the resin 10. The resin 10 has a concave portion 30 at an upper surface and a concave portion 40 at a rearface. The concave portion 30 is formed by an ejector pin 320 to be described later. The concave portion 40 is formed by an ejector 340 to be described later.

Figure 2:
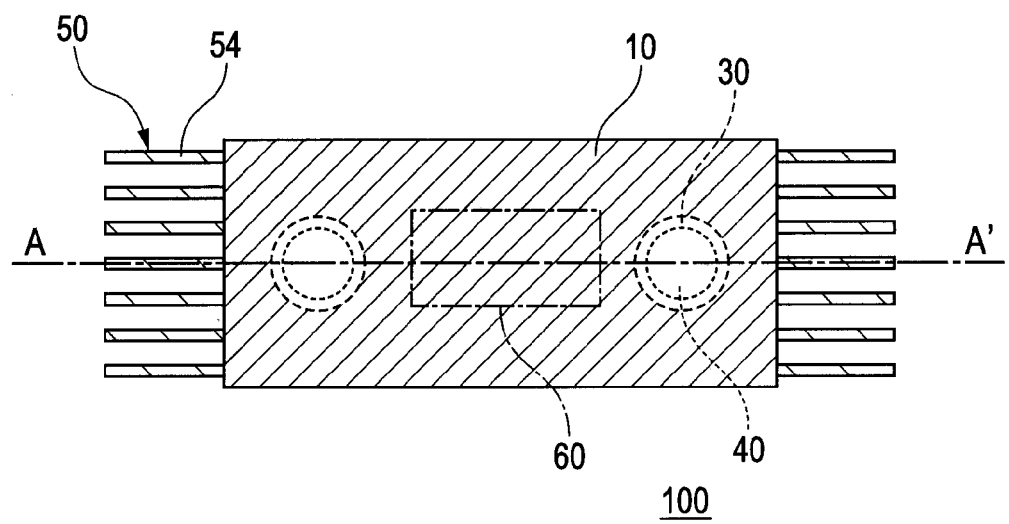
FIG. 2 is a plan view showing the semiconductor package shown in FIG. 1.

FIG. 2 is a plan view showing the semiconductor package 100 shown in FIG. 1. The concave portion 40 is situated inside the concave portion 30 in a plan view.

Figure 3:
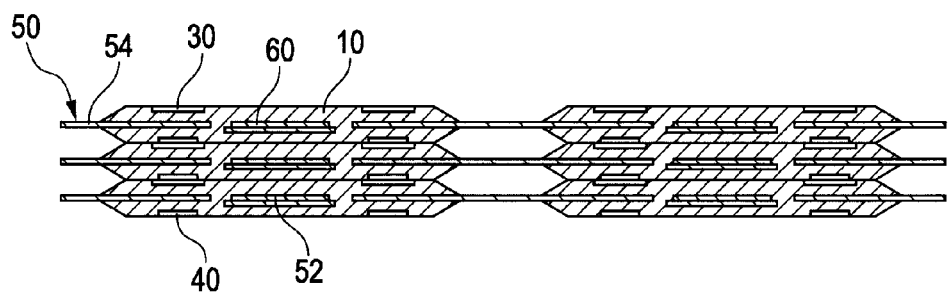
FIG. 3 is a cross sectional view showing a method of storing the semiconductor package shown in FIG. 1.

FIG. 3 is a cross sectional view showing a method of storing the semiconductor package 100 shown in FIG. 1. In the method of the storing semiconductor package 100, multiple semiconductor packages 100 are stored on the unit of frame where the lead frames 50 are contiguous with each other, and multiple frames are stored in stack. Further, the semiconductor packages 100 are stored in stack. As described above, the concave portion 40 is situated inside the concave portion 30. Accordingly, the concave portion 40 disposed at the rearface of the semiconductor package is situated inside the concave portion 30 disposed at the surface of the semiconductor package 100 on the lower side.

Figure 4:
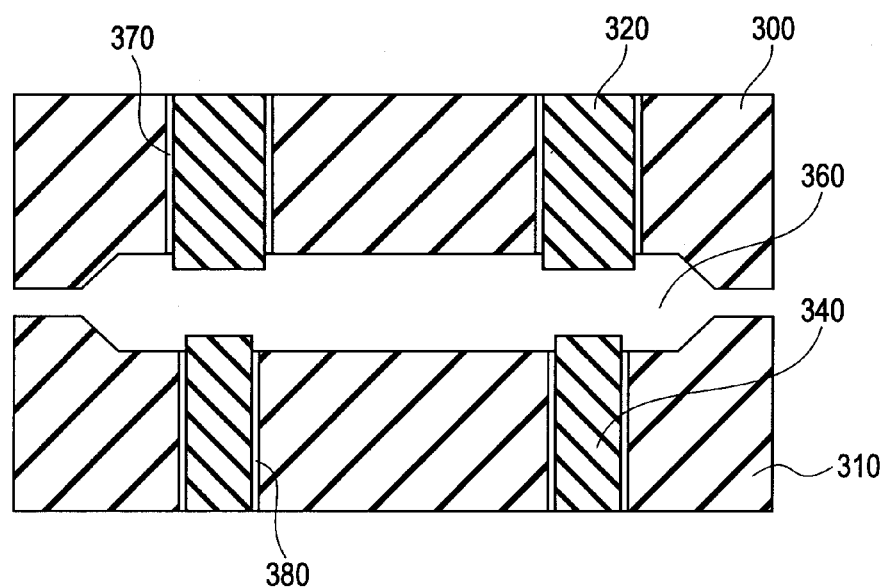
FIG. 4 is a cross sectional view showing an apparatus for manufacturing the semiconductor package shown in FIG. 1.

FIG. 4 is a cross sectional view showing an apparatus for manufacturing the semiconductor package 100 shown in FIG. 1. The manufacturing apparatus has an upper die 300, a lower die 310, an ejector pin 320, and an ejector pin 340. The upper die 300 and the lower die 310 are stacked to each other to form a cavity 360. The upper die 300 has a through hole 370 above the cavity 360. The lower die 310 has a through hole 380 below the cavity 360. The ejector pin 320 can protrude from the inside of the through hole 370 to the inside of the cavity 360. Further, the ejector pin 340 can protrude from the inside of the through hole 380 to the inside of the cavity 360.

Figure 5:
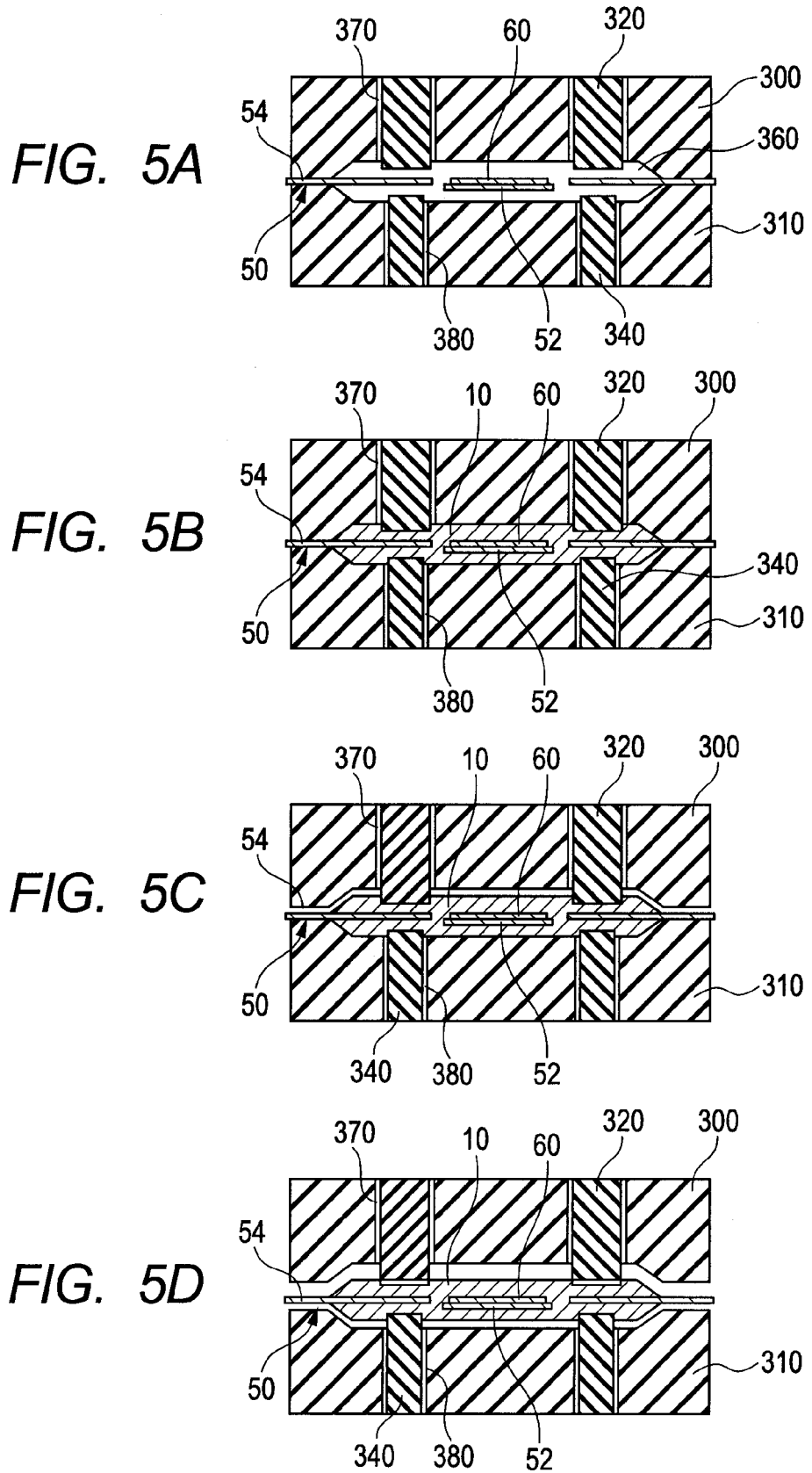

FIG. 5 is a cross sectional view showing a method of manufacturing the semiconductor apparatus 100 shown in FIG. 1. At first, a lead frame 50 in which a semiconductor chip 60 is mounted on a die pad 52 is disposed in a cavity 360 (FIG. 5A). Then, the inside of the cavity 60 is filled with a resin 10 in a state of slightly producing an ejector pin 320 from the upper surface of the cavity 360 and slight projecting an ejector pin 340 from the lower surface of the cavity 360 (FIG. 5B). Thus, the semiconductor package 100 is molded in the cavity 360. In this case, a concave portion 30 is formed at the surface of the semiconductor package 100 by the ejector pin 320 protruding from the upper surface of the cavity 360. In the same manner, a concave portion 40 is formed at the rearface of the semiconductor package 100 and the concave portion 30 is formed at the surface of the semiconductor package 100 by the ejector pin 340 protruding from the lower surface of the cavity 360.

Then, the surface of the semiconductor package 100 is pushed by the ejector pin 320 (FIG. 5C). Thus, the semiconductor package 100 is separated from an upper die 300. Further, the rearface of the semiconductor package 100 is pushed by the ejector pin 340 (FIG. 5D). Thus, the semiconductor package 100 is separated from the lower die 310. Resin burrs (not illustrated) are formed at the peripheral edge of the concave portion 30 and the concave portion 40.

Figure 6:
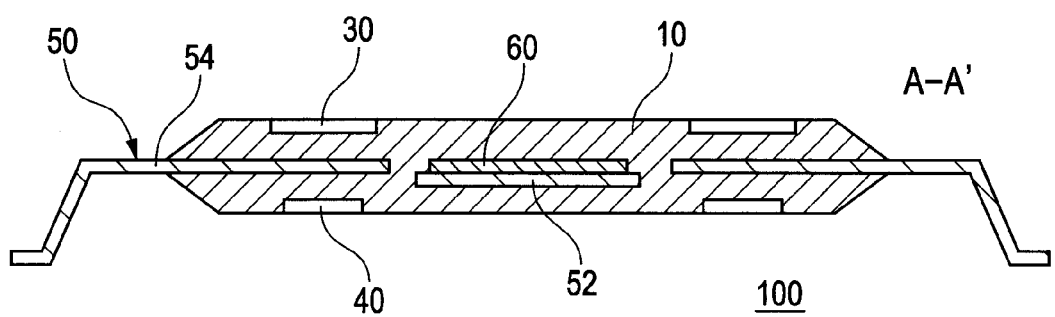
FIG. 6 is a cross sectional view showing the semiconductor package shown in FIG. 1.

FIG. 6 is a cross sectional view showing the semiconductor package 100 shown in FIG. 1. The cross sectional view shown in FIG. 6 shows the semiconductor package 100 after bending lead terminals 54. The lead terminals 54 of the semiconductor package 100 are bent toward a mounting surface upon mounting to a mounting substrate. That is, the rearface provided with the concave portion 40 is a mounting surface. Further, the surface provided with the concave portion 30 is a surface to be sealed and imprinted, at a portion not overlapping the concave portion 30.

Figure 7:
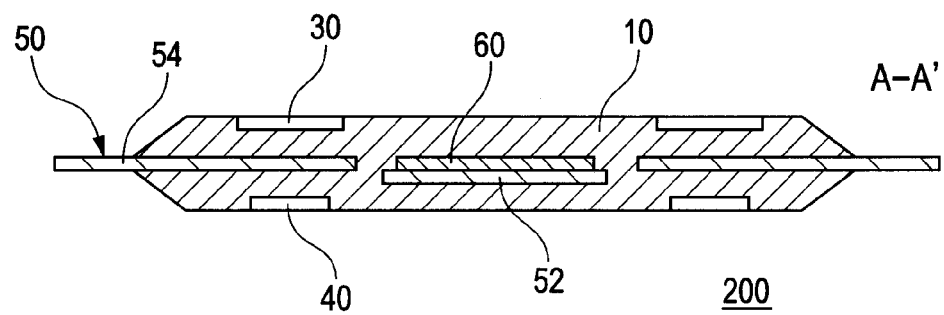
FIG. 7 is a cross sectional view showing a semiconductor package according to comparative example.

The function and the effect of this embodiment are to be described below. FIG. 7 is a cross sectional view of a semiconductor package 200 according to a comparative example which corresponds to FIG. 1 according to the preferred embodiment of the invention. According to the comparative example, a concave portion 40 disposed to a semiconductor package 200 is not situates inside the concave portion 30 in a plan view. Therefore, when semiconductor packages 200 are stacked to each other, resin burrs formed at the peripheral edge of the concave portion 40 disposed at the rearface of the semiconductor package 200 situated on the upper side do not situate inside the concave portion 30 disposed at the surface of the semiconductor package 200 situated on the lower side and are in contact with the surface of the semiconductor package 200 situated on the lower side. This results in occurrence of flaws to the surface of the semiconductor package 200.

On the contrary, according to the preferred embodiment of the invention, the concave portion 40 formed in the semiconductor package 100 is situated inside the concave portion 30 in a plan view. Therefore, when the semiconductor packages 100 are stored being stacked to each other, resin burrs formed at the peripheral edge of the concave portion 40 disposed at the rearface of the semiconductor package 100 situated on the upper side situate inside the concave portion 30 disposed at the surface of the semiconductor package 100 situated on the lower side and are not in contact with the surface of the semiconductor package 100 situated on the lower side. Accordingly, this can prevent flaws from being formed to the surface of the semiconductor package 100.

Then, it may suffice that the semiconductor package 100 has such a thickness as capable of ensuring the depth of the concave portion 30 and the concave portion 40. Accordingly, it is possible to prevent the appearance from being impaired at the surface of the semiconductor package and decrease the thickness of the semiconductor package without performing the operation of removing the resin burrs after molding of the semiconductor package. Further, since the flaws can be suppressed from being formed at the surface of the semiconductor package as the surface to be sealed, the recognizability of information imprinted to the semiconductor package can be kept favorably. Further, it is not necessary to extend the concaved portion to more than the depression formed by the ejector pin, which can suppress narrowing of the surface to be imprinted.

While the preferred embodiment of the invention has been described with reference to the drawings, this is an example of the invention and various other constitutions than those described above can be adopted.

What is claimed is:

1. A method of manufacturing a semiconductor device comprising the steps of:
    (a) arranging a lead frame where a semiconductor chip is mounted on a die pad in a cavity of a molding die;
    (b) filling the cavity with a resin and sealing the semiconductor chip and the die pad from an upper surface of the cavity and a lower surface of the cavity with the resin; and
    (c) pushing out the lead frame from the molding die by a first ejector pin protruding from the upper surface of the cavity and a second ejector pin protruding from the lower surface of the cavity, a diameter of the first ejector pin being greater than a diameter of the second ejector pin,
    wherein a portion of the second ejector pin pressing to the resin is situated inside a portion of the first ejector pin pressing the resin.

2. The method of manufacturing the semiconductor device according to claim 1, wherein, after the step (c), (d) stacking the lead frames, respectively, such that a top surface formed by the upper surface of the cavity of the resin of one lead flame faces to a bottom surface formed by the lower surface of the cavity of the resin of other lead frame.

3. The method of manufacturing the semiconductor device according to claim 2, wherein between the steps (c) and (d), (e) marking on the top surface of the resin.

4. The method of manufacturing the semiconductor device according to claim 1, wherein the first ejector pin protrudes from a through hole.

5. The method of manufacturing the semiconductor device according to claim 1, wherein the second ejector pin protrudes from a through hole.

6. The method of manufacturing the semiconductor device according to claim 1, wherein the first ejector pin forms a concave portion on a surface of the resin.

7. The method of manufacturing the semiconductor device according to claim 6, wherein the surface of the resin is sealed and imprinted at a portion not overlapping the concave portion.

8. The method of manufacturing the semiconductor device according to claim 1, wherein the second ejector pin forms a concave portion on a rearface of the resin.

9. The method of manufacturing the semiconductor device according to claim 7, wherein the concave portion is a mounting surface.

10. The method of manufacturing the semiconductor device according to claim 1, wherein the first ejector pin forms a first concave portion on a surface of the resin, and the second ejector pin forms a second concave portion on a rearface of the resin, and the second concave portion is situated inside the first concave portion in plan view.

* * * * *